United States Patent
Poolla et al.

(10) Patent No.: US 7,016,754 B2
(45) Date of Patent: Mar. 21, 2006

(54) METHODS OF AND APPARATUS FOR CONTROLLING PROCESS PROFILES

(75) Inventors: Kameshwar Poolla, Berkeley, CA (US); Costas J. Spanos, Lafayette, CA (US)

(73) Assignee: OnWafer Technologies, Inc., Dublin, CA (US)

( * ) Notice: Subject to any disclaimer, the term of this patent is extended or adjusted under 35 U.S.C. 154(b) by 137 days.

(21) Appl. No.: 10/673,049

(22) Filed: Sep. 26, 2003

(65) Prior Publication Data

US 2004/0249604 A1 Dec. 9, 2004

Related U.S. Application Data

(60) Provisional application No. 60/469,377, filed on May 8, 2003.

(51) Int. Cl.
*G06F 19/00* (2006.01)

(52) U.S. Cl. .................. 700/121; 700/109; 438/14
(58) Field of Classification Search .............. 700/121, 700/109–110; 438/5, 17, 14, 15; 702/81, 702/84

See application file for complete search history.

(56) References Cited

U.S. PATENT DOCUMENTS

| | | | | |
|---|---|---|---|---|
| 5,444,637 A | | 8/1995 | Smesny et al. .............. 364/556 |
| 5,526,293 A | | 6/1996 | Mozumder et al. .......... 364/578 |
| 5,635,409 A | * | 6/1997 | Moslehi ......................... 438/7 |
| 5,907,820 A | | 5/1999 | Pan .............................. 702/155 |
| 5,967,661 A | | 10/1999 | Renken et al. .............. 374/126 |
| 5,969,639 A | | 10/1999 | Lauf et al. ............ 340/870.17 |
| 6,033,922 A | | 3/2000 | Rowland et al. .............. 438/14 |
| 6,244,121 B1 | | 6/2001 | Hunter ....................... 73/865.9 |
| 6,285,971 B1 | | 9/2001 | Shah et al. ..................... 703/2 |
| 6,535,774 B1 | * | 3/2003 | Bode et al. ................. 700/109 |
| 6,542,835 B1 | | 4/2003 | Mundt .......................... 702/65 |
| 6,642,853 B1 | | 11/2003 | Hunter .................. 340/870.16 |
| 6,643,596 B1 | * | 11/2003 | Firth et al. ..................... 702/84 |
| 6,691,068 B1 | | 2/2004 | Freed et al. ................. 702/187 |
| 6,698,009 B1 | * | 2/2004 | Pasadyn et al. ............... 716/19 |
| 6,718,224 B1 | * | 4/2004 | Firth et al. .................. 700/121 |
| 6,766,214 B1 | * | 7/2004 | Wang et al. ................ 700/121 |
| 6,772,035 B1 | * | 8/2004 | Mouli ......................... 700/121 |
| 2002/0177916 A1 | | 11/2002 | Poolla et al. | |
| 2002/0177917 A1 | | 11/2002 | Polla et al. | |
| 2003/0018928 A1 | * | 1/2003 | James et al. .................. 714/25 |

OTHER PUBLICATIONS

U.S. Appl. No. 60/469,377, filed May 8, 2003.

* cited by examiner

*Primary Examiner*—Zoila Cabrera
(74) *Attorney, Agent, or Firm*—Larry Williams (57) ABSTRACT

Presented are methods and apparatus for controlling the processing of a substrate during a process step that is sensitive to one or more process conditions. One embodiment includes a method performed with corresponding apparatus that includes a controller. One step includes constructing a perturbation model relating changes in control parameters for the apparatus to one or more resulting changes in the process. The method also includes the step of using the perturbation model with at least one of a performance objective and a constraint to derive optimized control parameters for the controller. Another step in the method includes operating the controller with the optimized control parameters. Another embodiment includes an apparatus for processing substrates where the apparatus comprises optimized control parameters.

21 Claims, 6 Drawing Sheets

METHODS OF AND APPARATUS FOR CONTROLLING PROCESS PROFILES

CROSS-REFERENCES

The present application claims benefit of U.S. Patent Application No. 60/469,377, filed on 8 May 2003. The present application is related to U.S. Patent Application No. 09/643,614, now U.S. Pat. No. 6,691,068, filed on 22 Aug. 2000 and U.S. Pat. No. 6,542,835, filed on 22 Mar. 2001. All of these applications and patents are incorporated herein, in their entirety, by this reference.

BACKGROUND

Modern semiconductor device manufacture involves process steps that need to be performed with a high degree of control of the process conditions. In fact, failure to adequately control the process conditions can result in lower device yield and/or poor device performance. An example of a semiconductor wafer processing step in which a high degree of control of the process conditions is necessary is the transfer of fine patterns onto a workpiece such as a silicon wafer or other suitable substrate.

Figure 1:
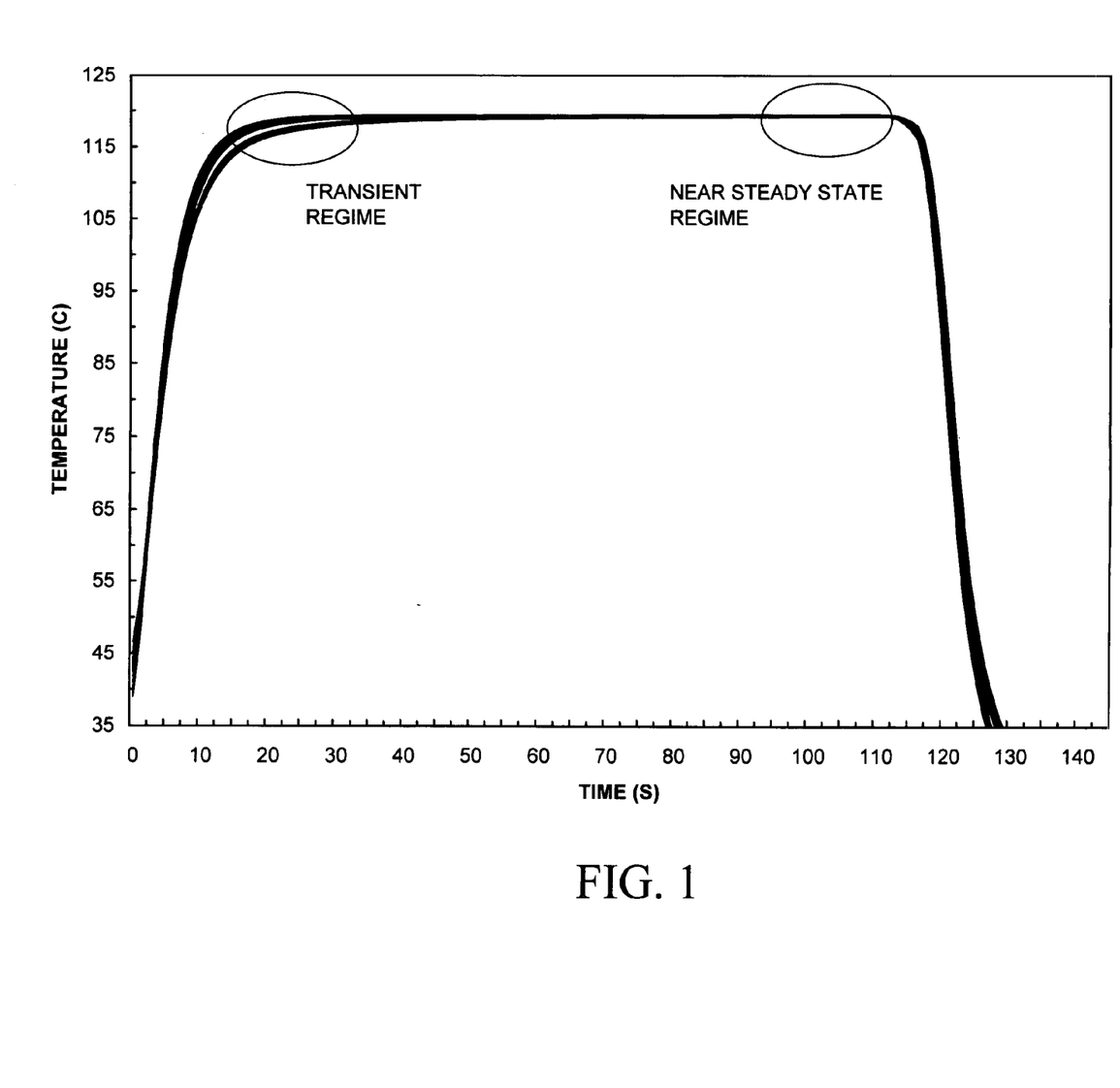
FIG. 1. Temperature regimes in a typical temperature trajectory experienced by a semiconductor wafer in a bake process.

Photolithography is typically used to achieve the pattern transfer. Here, the workpiece such as a silicon wafer is covered with a light-sensitive material called photoresist. Light is projected onto the wafer through a mask and an optical system to selectively expose certain areas of the photoresist. The wafer is baked in a post exposure bake (PEB) step to activate but also diffuse the photosensitive compounds in the resist. This PEB step is critical for photolithography, and it enables very fine pattern transfer. Typically, the PEB step involves baking a wafer at 120° C. for 120 seconds. It is important to note that the actual temperature trajectory experienced by the wafer has a transient regime where the wafer temperature rises rapidly (usually in about 10–20 seconds) from ambient to about the temperature set point, and a near steady-state regime towards the end of the bake step (usually after about 30–60 seconds) where the temperatures are not changing significantly. The temperature regimes can be seen in FIG. 1 where there is shown a plot of temperature as a function of time at several locations on a semiconductor wafer subjected to a typical PEB process. It is also important to note that different locations on the wafer typically experience different temperature trajectories.

A central objective in semiconductor device manufacturing is to ensure reliable and repeatable pattern transfer. The common metric for this objective is the critical dimension (CD), which is the width of specific features printed on the wafers. It is very important to ensure that the CD is as close to the specified width as possible, preferably at all points on the wafer. In other words, there is a need for tightly controlling the CD uniformity across the wafer and make the mean CD as close to the target CD as possible. It is well known that the entire temperature trajectory, including both the transient and the near steady-state components, in the PEB step has a great impact on CD. Thus, controlling the temperature trajectories across the wafer is a means of controlling across wafer CD.

Some modern PEB plate designs have several control parameters $\alpha=[\alpha_1, \alpha_2, \ldots, \alpha_N]$ which directly influence the spatial behavior of the temperature profiles experienced by the wafer. Some PEB plates even have multiple heating elements or zones that can be individually controlled. These include but are not limited to proportional integral derivative (PID) gains for each zone, airflow settings, and set-point adjustments for each zone. Other important parameters that cannot be easily controlled include the proximity distance between the plate and the work piece, the leveling of the work piece, the speed and direction of the wafer handling robotics, etc.

The current standard practice for calibrating temperature profiles for PEB processes is limited to the far steady-state regimes, and the calibration typically uses a trial and error procedure. Far steady state refers to the time after the temperatures across the wafer exhibit substantially no observable variations; this is usually about 10 or more minutes for PEB processes. In other words, the "far steady state" conditions cannot be achieved during the 60–120 seconds of normal processing of production wafers. To measure the "far steady state," a special wafer outfitted with temperature sensors is placed on the bake plate manually or by robotics. The temperature sensors are typically tethered to an outside instrument that can record their temperature as a function of time. An operator waits a certain amount of time for the temperature transients to decay and the temperatures of the wafer to reach steady state. The steady-state temperature data is analyzed. Typically, averages of these temperatures are determined in various zones or regions. These temperature averages are compared to the desired temperature value or set point. Based on calculated differences, a look-up table is used to adjust the control parameters such as PID gains or offsets, etc on the bake-plate. In some cases, these parameters can be adjusted by trial and error, where small changes are introduced, and, after the system has time to settle, new readings are collected, and so on. This trial and error procedure can even be automated using typically heuristic algorithms.

In summary, the standard technology practice for PEB has two characteristics. First, the calibration is conducted in the far steady state regime of 10 or more minutes into the bake step. Second, actual production wafers never experience the far steady-state regime because the typical bake times are almost never longer than about 120 seconds. This is because some of the resist components diffuse during PEB, and long PEB times would severely distort the fine features one attempts to transfer during the lithography process.

There is a need for improved methods for controlling and/or calibrating transient and steady state temperature profiles for post exposure bake processes. There is also a need for improved methods for controlling and/or calibrating transient and steady state temperature profiles for other types of substrate processing applications and processes. Examples of applications are processing substrates for manufacturing electronic devices such as integrated circuits on semiconductor wafers, mask for lithography processes, and substrates for flat panel displays. Examples of other types of processes are processes such as plasma etch processes, chemical vapor deposition processes, rapid thermal anneal processes, and ion implantation processes. These processes suffer similar problems and consequently there is a need for improved methods for controlling and/or calibrating transient and steady state temperature profiles for workpieces used therein.

SUMMARY

Substrate profiles during process steps are controlled by optimization of control parameters using a perturbation model. An aspect of the present invention includes a method of optimizing the control parameters. One embodiment includes a method performed with corresponding apparatus that includes a controller. One step of the method includes constructing a perturbation model relating changes in control parameters for the apparatus to the resulting changes in the temperature profile of the substrate at any given time during the process. The method also includes the step of using the perturbation model with at least one of a performance objective and a constraint to derive optimized control parameters for the controller. Another step in the method includes operating the controller with the optimized control parameters. A second aspect of the present invention is an apparatus for processing substrates. In one embodiment, the apparatus includes a controller that comprises the optimized control parameters.

It is to be understood that the invention is not limited in its application to the details of construction and to the arrangements of the components set forth in the following description or illustrated in the drawings. The invention is capable of other embodiments and of being practiced and carried out in various ways. In addition, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods, and systems for carrying out aspects of the present invention. It is important, therefore, that the claims be regarded as including such equivalent constructions insofar as they do not depart from the spirit and scope of the present invention.

The above and still further features and advantages of the present invention will become apparent upon consideration of the following detailed descriptions of specific embodiments thereof, especially when taken in conjunction with the accompanying drawings.

DESCRIPTION

The present invention now will be described more fully hereinafter with reference to the accompanying drawings in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

For illustrative purposes, the various apparatus, methods, and computer program products of the present invention are illustrated and described below primarily in conjunction with processes and apparatuses for post exposure bake of substrates for manufacturing semiconductor devices. The post exposure bake processes are typically carried out using an apparatus that includes a bake plate. It should be apparent, however, that the apparatus, methods, and computer program products of the present invention could be used with many different types of processes and apparatuses. For instance, the apparatus, methods, and computer program products may be used for processes such as plasma etch processes, chemical vapor deposition processes, rapid thermal anneal processes, ion implantation processes, and other processes used for manufacturing products.

Furthermore, while a preferred embodiment of the present invention has been used to manipulate temperature profiles (that is, temperature as a function of position and time), it is to be understood that embodiments of the present invention are not to be limited to temperature profiles. In view of the following teachings, it will be clear to one of ordinary skill in the art that an extension of the techniques taught herein result in additional embodiments of the present invention that incorporate the manipulation of variables other than or in addition to temperature, or even the combination of many different variables. For example, embodiments of the present invention for processing a substrate with a glow discharge plasma may included variables such as plasma potential, ion energy, ion density, heat flux, etc. This list is not exhaustive and is provided to show mere examples.

Figure 2:
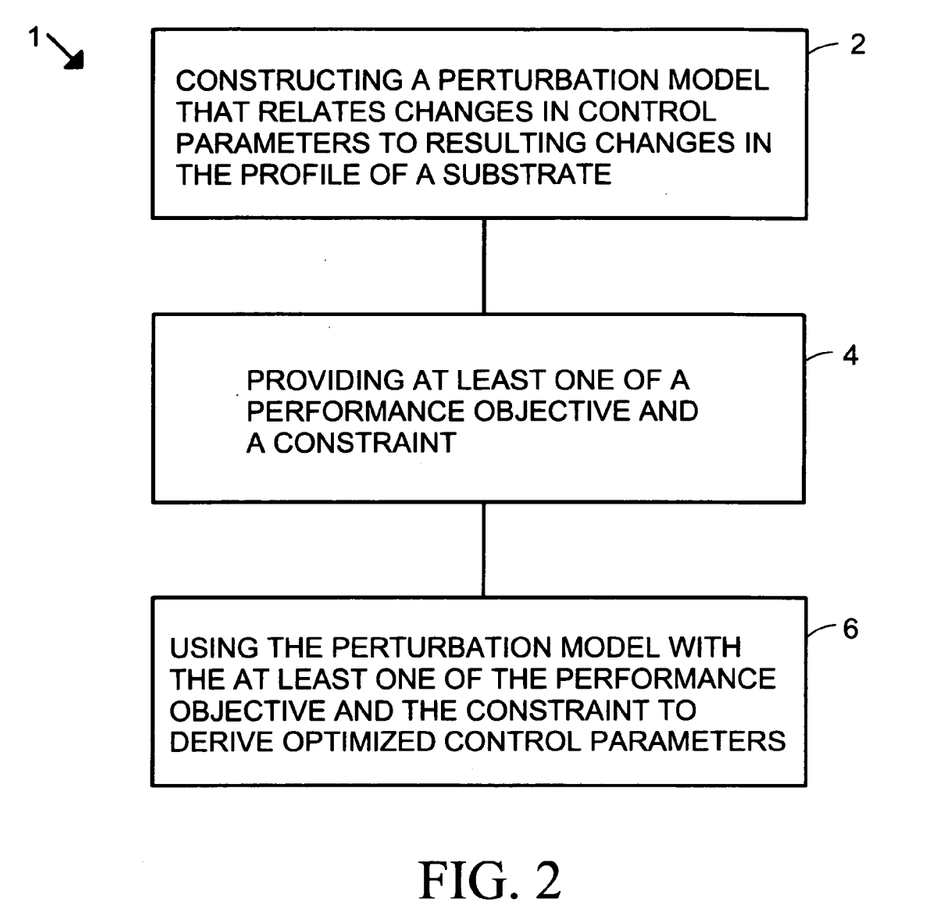
FIG. 2. Flow chart of one embodiment according to the present invention.

Reference is now made to FIG. 2 where there is shown a method presented as a flowchart 1 according to one embodiment of the present invention. The method is performed for an apparatus for processing substrates. The apparatus includes or is connected with a controller. The controller operates using one or more control parameters. The method pertains to controlling or adjusting and/or calibrating a process parameter of the substrates such as a temperature profile of the substrate during a process for which the process results are sensitive to the process parameter such as the temperature profile of the substrate. FIG. 2 shows flowchart 1 having three steps: step 2, step 4, and step 6. Step 2 includes constructing a perturbation model that relates changes in the control parameters to resulting changes in the process parameter such as the temperature profile of the substrate during processing. Step 4 includes providing at least one of a performance objective and a constraint. The performance objective and constraint are provided based on the requirements for controlling and/or calibrating the temperature profile for the substrate. Step 6 includes using the perturbation model with the at least one of the performance objective(s) and the constraint to derive optimized control parameters. The optimized control parameters are derived by performing calculations to meet the requirements of the performance objective(s) and the constraint. The optimized control parameters can be incorporated into the controller so that substrates can be processed with the process apparatus using the optimized control parameters.

Figure 3:
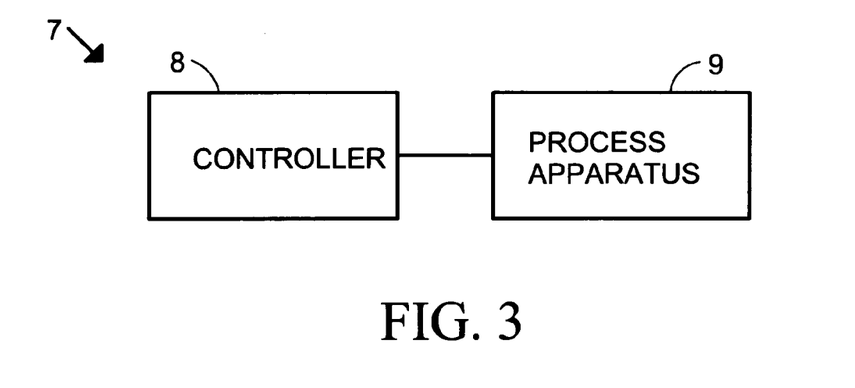
FIG. 3. Apparatus according to one embodiment of the present invention.

Reference is now made to FIG. 3 where there is shown a block diagram of an apparatus 7 according to one embodiment of the present invention. Apparatus 7 includes a controller 8 and a process apparatus 9. Process apparatus 9 is configured for processing one or more substrates. The process results for the processes performed by apparatus 9 are sensitive to the temperature profile of the substrate. Controller 8 and apparatus 9 are coupled so that controller 8 is capable of controlling apparatus 9. Controller 8 is configured to be operable with one or more optimized control parameters for controlling the temperature profile of the substrate where the optimized control parameters are obtained by a method according to the teachings of one embodiment of the present invention. In other words, apparatus 7 includes the optimized control parameters and is capable of processing substrates using the optimized control parameters. Optionally, controller 8 and apparatus 9 may be combined into a single unit. In other words, controller 8 may be an integral part of apparatus 9 for some embodiments of the present invention.

Apparatus 7 may be configured so as to be capable of performing a wide variety of substrate processing applications. Some examples of suitable configurations for apparatus 7 are configurations for processing high-value substrates such as semiconductor wafers, lithography masks for processing integrated circuits, and flatpanel display substrates. Additional examples are configurations for plasma etch, configurations for chemical vapor deposition, configurations for thermal anneal, configurations for ion implantation, configurations for post exposure bake, and configurations for physical vapor deposition. Each of the example configurations presented here include technology that is well known and published in the scientific and patent literature; further details of these well-known technologies will not be presented here.

The standard technologies have failed to completely solve the problems of controlling and/or calibrating transient and steady state temperature profiles in process apparatus such as a heating apparatus for a variety of reasons. One of the reasons is that the standard practice for controlling and/or calibrating temperature profiles involves performing the calibration step during the far steady state portion of the thermal process. This is done even though the thermal process may be completed before the workpiece experiences the far steady state temperature conditions and even though the most significant changes produced by the thermal process may occur long before the ar steady state conditions are achieved.

Another standard technology method for process control uses a run-to-run or lot-to-lot control methodology. This involves measuring the variables that are to be regulated, for example critical dimensions on product wafers, once per run or once per lot. A model of the entire process apparatus or system is constructed and updated adaptively. The control parameters are adjusted based on the model and using measurements of the regulated variables. The adjustments are made run-to-run or lot-to-lot by inverting the process apparatus model or system model.

Another well established standard technology for regulating slowly varying systems is adaptive proportional integral derivative (PID) control. For such techniques, a model of the entire process apparatus or system is constructed and the controller parameters (usually PID gains) are either directly adjusted based on available measurements, or indirectly adjusted based on adaptively updating the process apparatus or system model.

In contrast to the standard technologies that use run-to-run or PID methodologies, embodiments of the present invention do not include constructing a model for the entire process apparatus or system. Instead, embodiments of the present invention include constructing a perturbation model that relates small changes in the control parameters to resulting small changes in the regulated variables for the process apparatus or system. The use of a perturbation model is beneficial because it provides a sufficiently accurate model, also, the perturbation model is less complex to implement and use than a complete model for the process apparatus. Most importantly, a perturbation model can be constructed on the basis of experimental data, with little or no intimate knowledge about the design and construction of the system in question.

One embodiment of the present system also includes regulating a closed loop system that includes the process apparatus or system and whatever control systems that are already incorporated with the process apparatus or system. In a preferred embodiment of the present invention, the control parameters that are adjusted include parameters for the control system that are already included in the process apparatus or system. Examples of the control parameters are set points and PID gains. For applications such as post exposure bake processes, the control parameters may include parameters of the process apparatus or system such as flow rates, plate tilt, airflow settings as well as temperature "offsets" used to adjust all or part of the plate in question. In other words, some embodiments of the present invention include adjusting the parameters of the process apparatus and adjusting parameters in the control system for the process apparatus. This is in contrast to the standard technology where typical run-to-run control only adjusts parameters in the process apparatus. This is also in contrast to the standard technology where adaptive PID techniques typically adjust only parameters in the control system. Furthermore, some embodiments of the present invention may include determining optimal adjustments of the control parameters using linear and nonlinear programming techniques.

In a preferred embodiment of the present invention, the substrate temperature trajectory is measured at various spatial locations on the substrate under conditions actually experienced by the substrate. A preferred method for obtaining the temperature trajectory data includes using a sensor apparatus such as the one described in U.S. application Ser. No. 09/643,614 filed 22 Aug. 2000, the contents of which are incorporated in their entirety by this reference. More preferably, the sensor apparatus is capable of autonomous operation so that there is no need for wires or cables connected to the sensor apparatus during the measurement process. This allows the sensor apparatus to move freely through the production equipment, thus experiencing realistic wafer transients due to the bake plate operation, as well as due to the operation of the wafer handling robotics.

Figure 4:
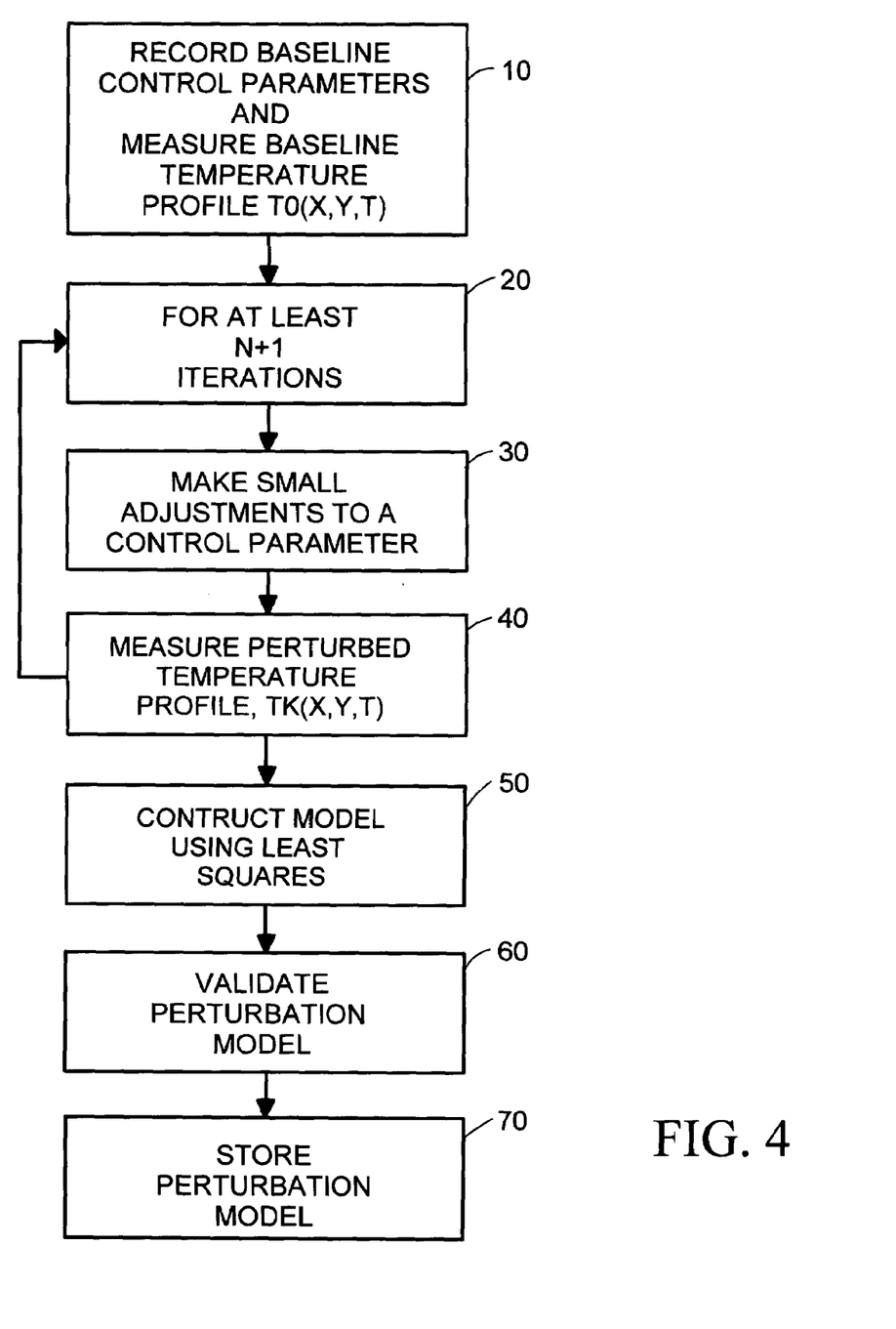
FIG. 4. Flowchart according to one embodiment of the present invention illustrating an algorithm to construct a perturbation model.

Reference is now made to FIG. 4 where there is shown a flowchart for a method of constructing a perturbation model according to one embodiment of the present invention. The perturbation model for the flowchart in FIG. 4 is a linear model that relates small changes in the control parameters to resulting small changes in the temperature profile for a substrate being processed. The perturbation model can be represented in the form of an equation such as equation (1).

$$T(x, y, t) = T_o(x, y, t) + \sum_{i=1}^{N} B_i(x, y, t)\Delta\alpha(i) \tag{1}$$

In equation (1), $T(x,y,t)$ represents spatial and temporal temperature profiles of the substrate, $T_o(x,y,t)$ represents an initial spatial and temporal temperature profile of the substrate, $B_i(x,y,t)$ represents basis functions (or matrices thereof) in the perturbation model, and $\Delta\alpha(i)$ represents perturbations in the $i^{th}$ control parameter from nominal $\alpha_o(i)$.

To complete the perturbation model, it is necessary to estimate the basis functions. This can be done by first obtaining perturbation data. Preferably, the data are obtained using a set of designed experiments using standard experimental design procedures. The model can be constructed using least square calculations.

With reference to FIG. 4, further details of the steps in the flowchart will be presented next. Step 10 in FIG. 4 includes recording baseline control parameter values $\alpha_0$ and measuring a baseline temperature profile $T_0(x,y,t)$. In a preferred embodiment, this step involves using a measurement apparatus such as a sensor wafer in the processing tool to obtain the spatial and time resolved temperature data. Optionally, the baseline values of the control parameters can be recorded manually or electronically.

Steps 20, 30, and 40 include conducting a series of designed experiments to obtain the data necessary to construct the perturbation model. For an embodiment having a number, N, control parameters, each of the parameters must be perturbed slightly, and the corresponding temperature profiles are recorded. The flowchart in FIG. 4 shows the series of experiments being carried out as an iterative loop. However, the control parameters need not be perturbed one at a time, as in some cases a more complex factorial or fractional factorial experiment might be preferred. Many other experimental designs are described in well-known relevant literature and could be used for this purpose. For these steps, a minimum of N experiments is necessary. Optionally, additional experiments can be performed to assist in constructing a more accurate perturbation model. The perturbations used in these steps must be small so as not to excite significant nonlinear dynamics in the operation of the process apparatus. Note that if it is so desired, nonlinear dynamics could be captured by this method, by using an appropriately structured experiment and an appropriately structured model. At the end of these steps 20, 30, and 40, a list of control parameters settings and corresponding temperature profiles will have been obtained that can be represented as $\alpha_K$ and $T_K(x,y,t)$, for K=1,2, ..., M. Optionally, the data can be stored manually or electronically.

Step 50 includes step of constructing the perturbation model, also referred to as the sensitivity model. This step includes aligning and synchronizing the temperature profile data so that the data share the same time scale. Optionally, a smoothing or filtering procedure may be used to smooth the data to remove spurious data noise. The perturbation model can be represented by equation (2).

$$T(x, y, t) = T_o(x, y, t) + \sum_{i=1}^{N} B_i(x, y, t)\Delta\alpha(i) \qquad (2)$$

Here the functions (or matrices) $B_i(x,y,t)$ are the basis functions in the perturbation model, and $\Delta\alpha(i)$ are the perturbations in the $i^{th}$ control parameter from nominal $\alpha_o(i)$. To complete the perturbation model, the basis functions are estimated. This can be done by the well-known method of least squares, even though non-linear programming techniques could be used to the same end if the model structure so warrants. For this, the data obtained in Steps 20–40 are represented as equation (3):

$$T_k(x, y, t) = T_o(x, y, t) + \sum_{i=1}^{N} B_i(x, y, t)\Delta\alpha_k(i) \qquad (3)$$

for k=1, 2, ... M. Here $\Delta\alpha_k(i)=\alpha_k(i)-\alpha_o(i)$. The associated least squares problem is then to choose the basis function $B_i(x,y,t)$ to minimize equation (4).

$$\sum_{k=1}^{M} \left\| T_k(x, y, t) - T_o(x, y, t) - \sum_{i=1}^{N} B_i(x, y, t)\Delta\alpha_k(i) \right\|^2 \qquad (4)$$

The step of minimizing equation (4) can be performed using well-known methods; there is also commercially available software for performing the minimization.

Step 60 includes the step of validating the perturbation model. This step involves first obtaining additional temperature profile data with random perturbations of the control parameters. The predictive capability of the perturbation model represented by equation (2) is then verified. This step is optional, but is strongly recommended for preferred embodiments of the present invention. Step 60 provides improved reliability for the method.

Step 70 includes storing the perturbation model for subsequent use. Here, the basis functions $B_i(x,y,t)$ are exported and saved. The details of performing this step are a matter of designer choice; there are numerous options for this step.

Another benefit of embodiments of the present invention is that the perturbation model is portable. In other words, the model is good across apparatus, such as heating apparatus, of the same type that are operated under similar conditions such as temperature, airflow etc. This means that embodiments of the present invention can include calibrating or optimizing heating apparatuses of the same type, operating under similar conditions, without reconstructing the perturbation model. Under such conditions, the perturbation model reconstruction is unnecessary.

For the embodiment shown in FIG. 4, one assumption is that perturbations to the control parameters are sufficiently small so that the behavior of the process apparatus or system is satisfactorily approximated by a linear perturbation model represented by equation (1). Another assumption is that the model for the process apparatus may be non-stationary but the dynamics drift slowly with time.

After the steps of constructing the perturbation model, embodiments of the invention further include using the model to solve a variety of control problems. Examples of the control problems are calibration at the near steady state regime, optimizing transient temperature responses to minimize spatial spread, and etc. The steps of solving the control problems include optimizing control parameters for the process apparatus or system. This involves obtaining an initial temperature profile $T_S(x,y,t)$ of the process apparatus or system that is to be controlled and obtaining the initial control parameter settings $\alpha_S$ for the process apparatus.

A performance objective represented by $J(T(x,y,t))$ is also defined based on the desired results for the solution for the control problem. Some example choices for the performance objective include, but are not limited, to the following:

Performance objective represented by equation (5) which is for calibration in the near steady state regime (NSSR), where TSS is the desired set point.

$$J(T(x,y,t)) = \max_{t \in NSSR} \max_{(x,y)} |T(x,y,t) - TSS| \quad (5)$$

Performance objective represented by equation (6) which is for minimizing the across wafer temperature spread in the transient regime (TR).

$$J(T(x,y,t)) = \max_{t \in TR} \max_{(x,y),(p,q)} |T(x,y,t) - T(p,q,t)| \quad (6)$$

Performance objective represented by equation (7), which is for matching the temperature profile as closely as possible to a preferred or "golden" signature $TG(x,y,t)$.

$$J(T(x,y,t)) = \max_t \max_{(x,y)} |T(x,y,t) - TG(x,y,t)| \quad (7)$$

As an option for each case, constraints may also be incorporated or used with the performance objective. Examples of constraints for preferred embodiments are demanding that the temperature overshoot be zero, demanding that the rise time be smaller than a predetermined threshold, and demanding that the settling time be smaller than a predetermined threshold. As a further example, the constraint of zero overshoot can be written as equation (8).

$$T(x,y,t) \leq T(x,y,t+1) \text{ for all } t \quad (8)$$

Typically, the constraints are linear in the independent arguments.

An example of the optimization problem that is to be solved to obtain the necessary perturbations in the control parameters can be represented as equation (9).

$$\min_{\Delta \alpha} J(T(x,y,t)) \text{ subject to constraints, where} \quad (9)$$

$$T(x, y, t) = T_S(x, y, t) + \sum_{i=1}^{N} B_i(x, y, t) \Delta \alpha(i)$$

Here $T_S(x,y,t)$ is the initial temperature profile, and $\Delta \alpha(i)$ is the change in the $i^{th}$ control parameter from its initial value $\alpha_S(i)$. Note that for this embodiment, the optimization problem is an instance of linear programming for each of the examples presented here.

Figure 5:
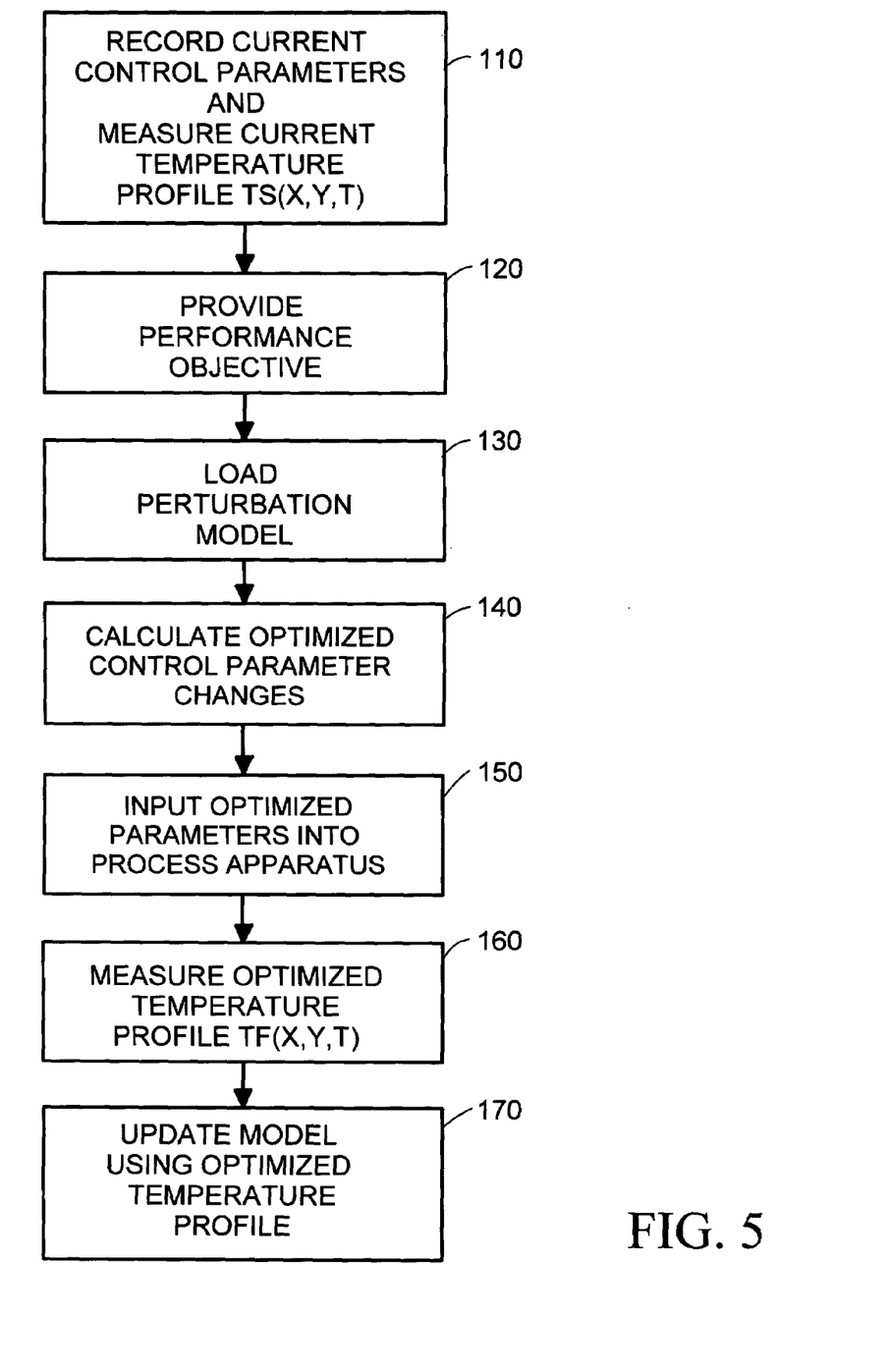
FIG. 5. Flowchart according to one embodiment of the present invention illustrating an algorithm to optimize the control parameters.

With reference to FIG. 5, a more detailed description of the steps of optimizing the control parameters is provided next for an embodiment of the present invention. FIG. 5 shows a flowchart representing an algorithm to optimize the control parameters. The first step after starting is step 110, which includes recording initial control parameter values $\alpha_S$ and measuring an initial temperature profile $T_S(x,y,t)$. Preferably, this step involves using a measurement apparatus such as a sensor wafer in the processing tool to obtain the spatially and time resolved temperature data. A detailed description of a suitable sensor wafer is described in U.S. application Ser. No. 09/643,614, filed on 22 Aug. 2000, the contents of which are incorporated herein by this reference. Optionally, the initial values of the control parameters can be recorded manually or electronically; preferred embodiments of the present invention include electronically recording the initial values of the control parameters.

FIG. 5 shows that step 120 includes deciding a performance objective $J(T(x,y,t))$ and constraints C. It is to be understood that the order of the step 110 and step 120 is unimportant for embodiments of the present invention. In other words, step 120 may be completed before completion of step 110 or step 110 may be completed before step 120. Still further, embodiments of the present invention may include having the performance objective and/or the constraints predetermined so that step 120 is unnecessary.

Step 130 involves loading the perturbation model that was constructed as described earlier using the steps shown in FIG. 4 for preferred embodiments. Step 130 includes electronically loading the perturbation model so that the equations for the model can be used in calculations performed in an information processor. Examples of suitable information processors are a computer and a microprocessor.

Step 140 includes calculating optimal control parameter changes. The calculations are performed using the model loaded in step 130, the performance objective, the constraints, and the control parameter values and temperature profiles from step 110. A preferred embodiment of the present invention includes using a linear programming solver or another standard optimization utility.

Step 150 involves inputting the optimal control parameters calculated in step 140 as the control parameters for the process apparatus. In other words, this step involves incorporating the optimal control parameters into the process apparatus so that the process apparatus can operate using the optimal control parameters. Optionally, this step may be done manually or it may be done using a direct equipment information interface of the process apparatus or system to be controlled and the information processor of step 130.

FIG. 5 shows step 160 as the step of measuring an optimized temperature profile $T_F(x,y,t)$. The optimized temperature profile results from operating the process apparatus using the optimal control parameters from step 140. For preferred embodiments, the measurements are obtained using a sensor wafer in the processing tool to obtain spatially and time resolved temperature data. This step is essentially a confirmation of the suitability of the optimal control parameters. Since this step is a confirmation step, this step is not required for all embodiments of the present invention. However, it is recommended that preferred embodiments of the present invention include step 160.

Step 170, shown in FIG. 5, includes updating the perturbation model. More specifically, this step includes using the optimized temperature profile $T_F(x,y,t)$ and the optimal control parameter settings $\alpha_F$ as yet another set of data in constructing the perturbation model. In other words, further improvements in the perturbation model are obtained using the optimized temperature profile and the optimal control parameter settings. This step may include updating the perturbation model adaptively by discounting or omitting old data sets. Optionally, the perturbation model may be updated periodically or at predetermined times depending on the requirements for operating the process apparatus.

Figure 6:
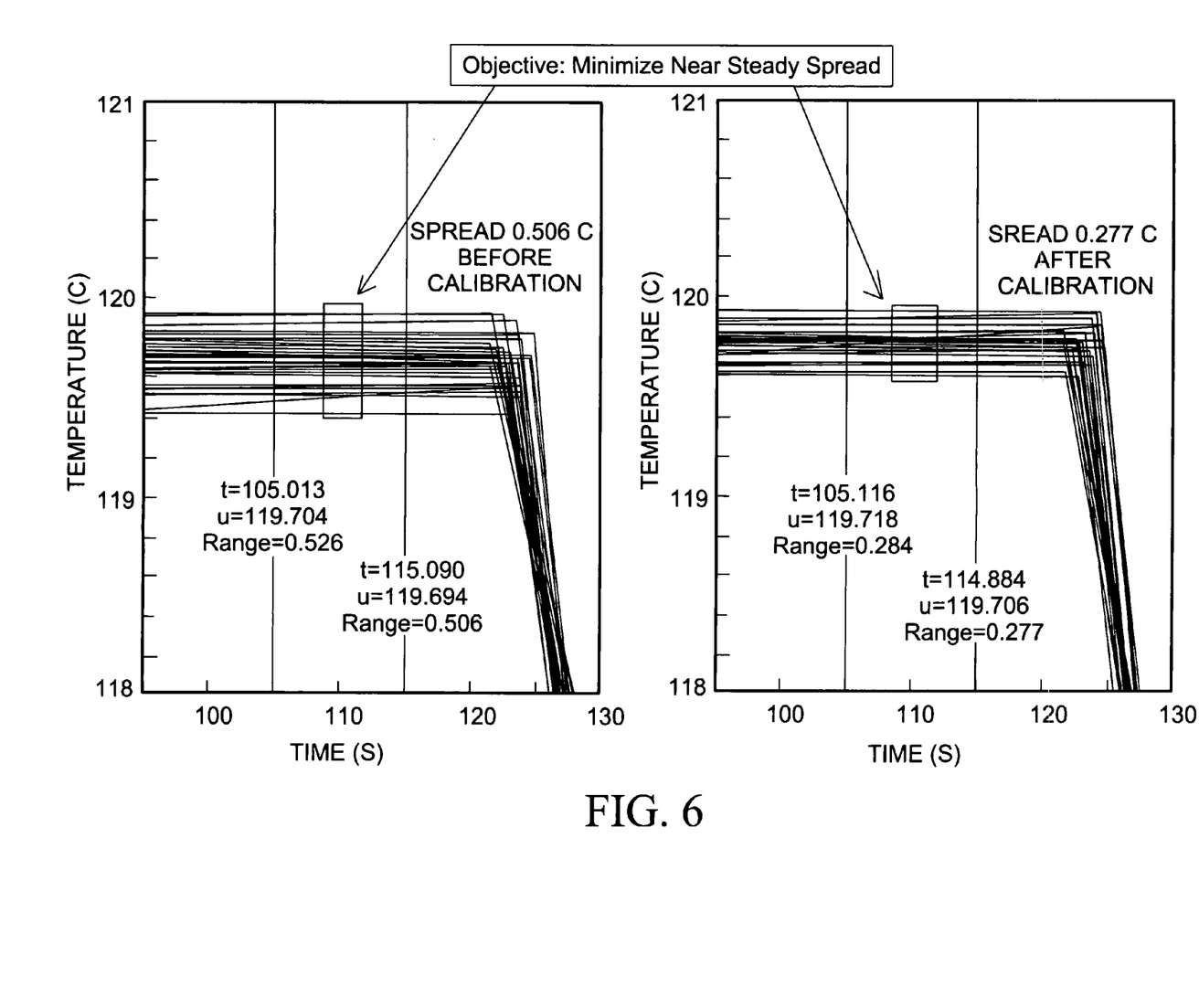
FIG. 6. Example results from one embodiment of the present invention compared with the standard technology.
Figure 7:
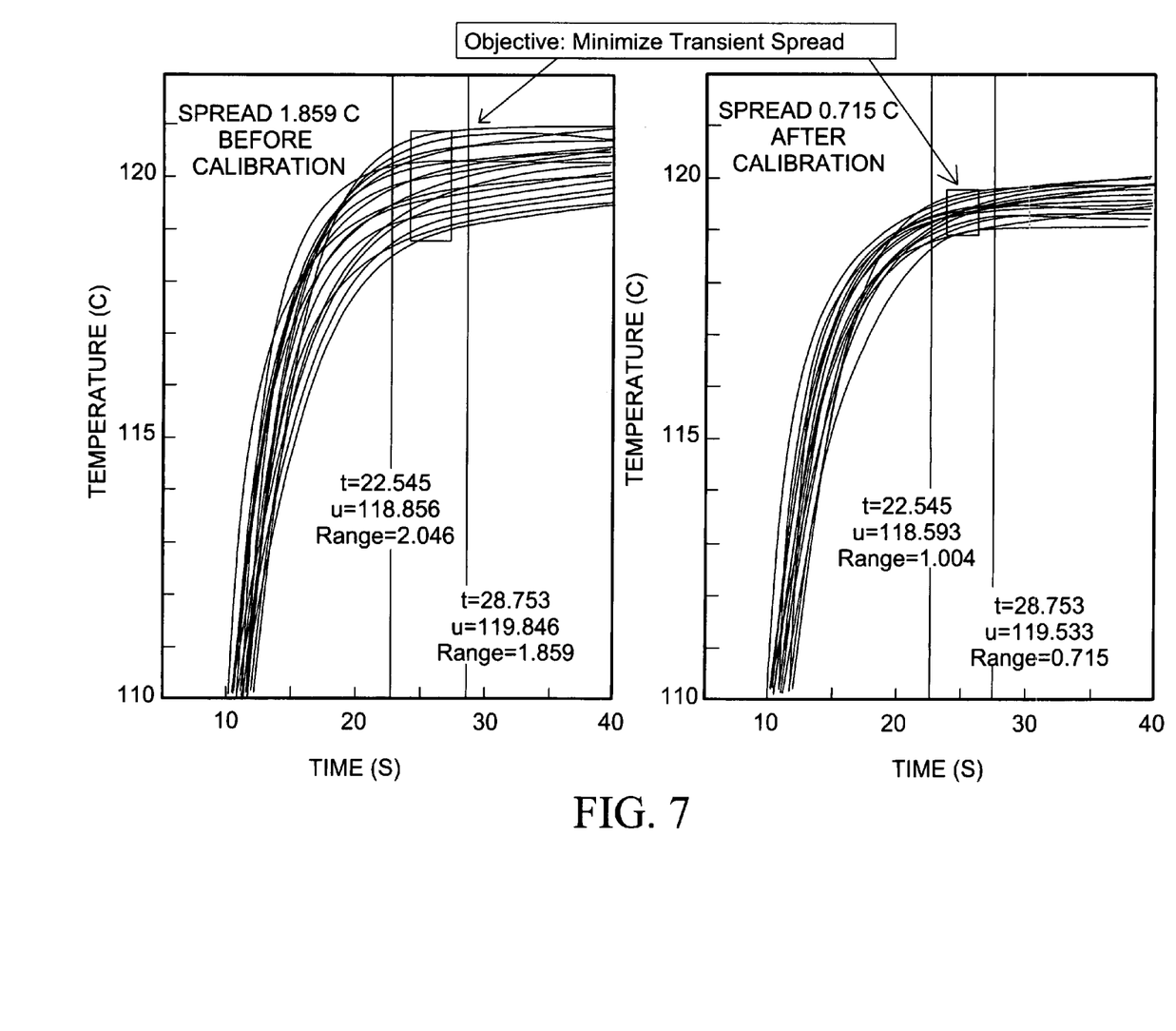
FIG. 7. Example results from one embodiment of the present invention compared with the standard technology.

Sample results from embodiments of the present invention are shown in FIG. 6 and FIG. 7 in comparison with results obtained without using the embodiments of the present invention. More specifically, FIG. 6 and FIG. 7 show graphs of temperature, vertical axis, as a function of time, horizontal axis, for a sensor apparatus subjected to a post exposure baked process. The post exposure baked process was performed in a process apparatus made by Tokyo Electron LTD for PEB processing of semiconductor wafers. The sensor apparatus is substantially the same as that disclosed in U.S. patent application Ser. No. 09/643,614, filed on 22 Aug. 2000. A suitable sensor apparatus is commercially available from OnWafer Technologies, Inc., Pleasant Hill, Calif. The sensor apparatus records temperature as a function of time at multiple locations (as of this writing the commercially available sensor wafer from OnWafer technologies has 42 sensors) on the sensor apparatus so as to provide a temperature profile for a substrate subjected to the process; the sensor apparatus is configured to have thermal properties similar to that of the semiconductor wafer that would be used in the process. The spread in temperature is obtained by measuring temperatures at all of the measurement sites on the sensor apparatus at essentially the same time; the temperature spread is the difference between the highest temperature measured and the lowest temperature measured.

Graph A of FIG. 6 shows a temperature profile measured for the process performed using control parameters according to the standard technology. For the near steady-state temperature regime, the spread in the temperature measurements at about 105 seconds was about 0.526° C. and at about 115 seconds was about 0.506° C. The average temperatures measured were 119.704° C. and 119.694° C. at about 105 seconds and about 115 seconds, respectively.

Graph B of FIG. 6 shows a temperature profile measured for the process performed using control parameters obtained according to an embodiment of the present invention. In other words, the data shown in graph B of FIG. 6 were obtained using optimized control parameters derived using a perturbation model for the PEB apparatus and an objective of minimizing the near steady-state regime temperature spread for the temperature profile. Graph B of FIG. 6 clearly shows that the temperature spread for the near steady-state regime is much smaller than that for Graph A of FIG. 6. The temperature spread for Graph B of FIG. 6 at about 105 seconds is about 0.284° C. and at about 115 seconds is about 0.277° C. The data for graph A and the data for graph B were collected under substantially the same conditions with the exception of using the optimized control parameters for the data for graph B. The average temperatures measured were 119.718° C. and 119.706° C. at about 105 seconds and about 115 seconds, respectively. The data for graph A and the data for graph B were collected under substantially the same conditions with the exception of using the optimized control parameters for the data for graph B.

Graph A of FIG. 7 shows a temperature profile measured for the process performed using control parameters according to the standard technology. The spread in the temperature measurements in the transient regime at about 29 seconds was about 1.859° C. The average temperature measured was 119.846° C.

Graph B of FIG. 7 shows a temperature profile measured for the process performed using control parameters obtained according to an embodiment of the present invention. In other words, the data shown in graph B of FIG. 7 were obtained using optimized control parameters derived using a perturbation model for the PEB apparatus and an objective of minimizing the transient regime temperature spread for the temperature profile. Graph B of FIG. 7 clearly shows that the temperature spread for the transient regime is much smaller than that for Graph A of FIG. 7. The temperature spread for Graph B of FIG. 7 is about 0.715° C. at about 29 seconds. The average temperature measured was 119.5330° C. The data for graph A and the data for graph B were collected under substantially the same conditions with the exception of using the optimized control parameters for the data for graph B.

An embodiment of the present invention includes a combination for processing a substrate that includes a controller operable with a number N of updated control parameters where N is at least one and a semiconductor wafer process chamber. The process chamber includes a heating device coupled to the controller to allow the controller to control the temperature of the substrate. The updated control parameters are derived by the steps of: constructing a perturbation model that relates changes in the control parameters to resulting changes in the temperature profile of the substrate and using the perturbation model with at least one of a performance objective and a constraint to derive the optimized control parameters.

Another embodiment of the present invention includes a method of calibrating a bake plate for post exposure bake of a substrate for the near steady state time period. The method includes the step of optimizing the control parameters for the temperature profile during the near steady state temperature regime. In a preferred embodiment, the control parameters are optimized for a bake process that is completed within about 90–120 seconds. This embodiment differs from the standard practice where the optimization is done for far steady conditions that occur after about five minutes of baking.

Another embodiment of the present invention includes determining optimal control parameter adjustments to minimize across wafer temperature spread. More specifically, the method includes determining optimal control parameters at predetermined time intervals such as the transient or the near-steady-state regimes. This embodiment can be used for applications such as post-exposure bake, post application bake, and other thermal steps in the lithography process flow for processing semiconductor wafers. A benefit of this embodiment is that the thermal variability in the lithography step is reduced, resulting in a tighter distribution of critical dimensions across the wafer.

Still another embodiment of the present invention includes a method of thermally processing a substrate using a proxy temperature profile so as to tightly control the critical dimension uniformity. The method includes the step of matching temperatures across a substrate such as semiconductor wafer as closely as possible to the proxy temperature profile. This matching is done both spatially and across time. The proxy temperature profile may be obtained by performing a set of designed experiments to determine the proxy temperature profile that results in the tightest distribution of critical dimensions across the wafer for one or more additional thermal processing steps for lithography processes for the wafer. It is to be understood that the proxy temperature profile may not be uniform across the wafer. Indeed, it is likely that the proxy temperature profile will be spatially non-uniform. In other words, the method includes generating the proxy temperature profile so that the results of using the proxy temperature profile will be capable of compensating for processing non-uniformities that occur as a result of other steps to which the wafer is subjected. The uniformity results obtained from using the desired or predetermined temperature profile are such that they are complementary to other uniformity results for other processing steps so that the combined uniformity results produce a higher degree of uniformity for the overall processing of the wafer.

Embodiments of the present invention can also be used to control temperature trajectories in plasma etchers, chemical vapor deposition tools, RTP ovens, ion implanters, and other types of equipment for processing substrates such as semiconductor wafers, lithography masks, and flat panel displays. The basic teachings of the present invention remain the same for various applications.

In view of the present disclosure, it will be clear to one of ordinary skill in the art that numerous alternative embodiments of the present invention are also possible. Some examples of alternative embodiments will be presented next. The preferred embodiments presented supra included using a sensor wafer for measuring temperatures in a process apparatus; however, other temperature sensing devices could be used to measure the temperature trajectories at the wafer surface, directly or indirectly. The temperature sensors could even be built into the process apparatus.

In another embodiment, constraints other than those presented supra can be imposed for the optimization step. For instance, a constraint such as confining the magnitude of the changes of the control variables can be used. Alternatively, a constraint that includes constraining the temperature profiles to have zero overshoot can be used.

Other embodiments of the present invention can use a variety of optimization algorithms to optimize the control variables α. For the embodiment given supra, the optimization problem reduces to a least squares calculation, but more generally, nonlinear programming may be included for the optimization steps for some embodiments of the present invention.

Some embodiments of the present invention may include optimization criteria comprising various competing optimization objectives. For example, an embodiment of the present invention may include the optimization objectives of minimizing the temperature spread in both the transient and the near steady-state regimes by using a weighted combination of all the optimization objectives.

Also, as an option in some embodiments of the present invention, various experiment designs methods could be used in constructing the perturbation model. For example, a nonlinear perturbation model may be used if second order effects are to be captured or if greater accuracy is desired.

While a preferred embodiment of the present invention has been used to manipulate temperature profiles, it is to be understood that embodiments of the present invention are not to be limited to temperature profiles. In view of the teachings presented in the present application, it would be clear to one of ordinary skill in the art that an extension of the techniques taught herein result in additional embodiments of the present invention that incorporate the manipulation of other types of variables, or even the combination of many different variables. An embodiment of the present invention for processing a substrate with a glow discharge plasma includes using methods presented supra to also measure parameters such as plasma potential, ion energy, ion density, heat flux, etc. All of these parameters could be monitored and recorded as a function of position and time, and all of them, separately or in combination, can be regulated using the methods described herein.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

As used herein, the terms "comprises," "comprising," "includes," "including," "has," "having," "at least one of," or any other variation thereof, are intended to cover a non-exclusive inclusion. For example, a process, method, article, or apparatus that comprises a list of elements is not necessarily limited only to those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

What is claimed is:

1. A method of adjusting a spatial and temporal profile of process conditions of a substrate during processing, the method being performed using a process apparatus and a controller, the controller and process apparatus being coupled so the controller is capable of controlling the spatial and temporal profile of process conditions experienced by the substrate, the controller being capable of using at least one control parameter, the method comprising the steps of:

i. constructing a perturbation model that relates changes in the control parameters to resulting changes in the spatial and temporal profile of process conditions experienced by the substrate, wherein constructing the perturbation model comprises:

a) measuring baseline control parameter values α0 comprising spatially resolved and time resolved conditions of the form T0(x,y,t);

b) acquiring data for a perturbation model for a number, N, of control parameters, N being at least 1, by performing a minimum of N condition profile measurements, wherein each profile results from perturbing one or more of the control parameters until each of the control parameters has been perturbed; and c) constructing the perturbation model by aligning and synchronizing the profile data so that the data share the same time scale to allow representing the perturbation model as $$T(x, y, t) = T_o(x, y, t) + \sum_{i=1}^{N} B_i(x, y, t)\Delta\alpha(i)$$

wherein the functions Bi(x,y,t) are basis functions in the perturbation model, and Δα(i) are the perturbations in the ith control parameter from nominal α0(i) and estimating the basis functions using the data from step b) to complete the perturbation model;

ii. using the perturbation model with at least one of a performance objective and a constraint to derive optimized control parameters; and iii. operating the controller with the optimized control parameters.

2. The method of claim 1 wherein the process comprises a process used for fabricating integrated circuits on semiconductor wafers.

3. The method of claim 1 wherein the process is selected from the group consisting of photolithography, plasma etch, chemical vapor deposition, thermal anneal, ion implantation, post exposure bake, and physical vapor deposition.

4. The method of claim 1 wherein the perturbation model comprises a linear model for small changes in the spatial and temporal profile of process conditions.

5. The method of claim 1 wherein the perturbation model comprises a nonlinear model for large changes in the spatial and temporal profile of process conditions.

6. The method of claim 1 wherein the optimized control parameters are derived using the performance objective and the constraint.

7. The method of claim 1 wherein the process includes a transient regime and a near steady-state regime and the optimized control parameters are derived in order to optimize at least one of
the transient regime and
the near steady-state regime.

8. The method of claim 1 wherein the process includes a transient regime and a near steady-state regime and the optimized control parameters are derived in order to optimize the transient regime.

9. The method of claim 1 wherein the process includes a transient period and a near steady-state regime and the optimized control parameters are derived in order to optimize the near steady-state regime.

10. The method of claim 1 wherein the process conditions are temperatures.

11. The method of claim 1 wherein step iii comprises adjusting the control parameters in the controller and using the adjustments so as to provide the optimized control parameters.

12. The method of claim 1 wherein the spatial and temporal profile comprises at least one of temperature, plasma potential, ion energy, ion density, and heat flux for the substrate in a glow discharge plasma process.

13. The method of claim 1 wherein the spatial and temporal profile comprises temperature of the substrate in a glow discharge plasma process.

14. The method of claim 1 wherein the substrate is selected from the group consisting of semiconductor wafer, flatpanel display, and photolithography mask.

15. A method of controlling temperature profiles of substrates for post exposure bake processes, the method being performed using a heating device and a controller, the controller and heating device being coupled so the controller is capable of controlling the temperature of the heating device, the controller being capable of using at least one control parameter, the method comprising the steps of:
a) measuring baseline control parameter values $\alpha 0$ comprising spatially resolved and time resolved temperature data of the form $T0(x,y,t)$;
b) acquiring data for a perturbation model for a number, N, of control parameters, N being at least 1, by performing a minimum of N temperature profile measurements, wherein each temperature profile results from perturbing one or more of the control parameters until each of the control parameters has been perturbed;
c) constructing the perturbation model by aligning and synchronizing the temperature profile data so that the data share the same time scale to allow representing the perturbation model as $$T(x, y, t) = T_o(x, y, t) + \sum_{i=1}^{N} B_i(x, y, t)\Delta\alpha(i)$$

where the functions $B_i(x,y,t)$ are basis functions in the perturbation model, and $\Delta\alpha(i)$ are the perturbations in the ith control parameter from nominal $\alpha 0(i)$ and estimating the basis functions using the data from step b) to complete the perturbation model;
d) measuring an initial temperature profile, $TS(x,y,t)$ of time resolved and spatially resolved temperature data;

e) providing a predetermined performance objective $J(T(x,y,t))$ and constraints C;
f) calculating adjustments for the control parameters using the initial temperature profile, the performance objective, the constraints, and the perturbation model;
g) adjusting the control parameters in the controller using the adjustments so as to provide updated control parameters; and
h) controlling the temperature of the substrates for post exposure bake processes using the updated control parameters.

16. The method of claim 15 wherein estimating the basis functions in step c) includes using least squares calculations on the data obtained in step b) for the equation $$T_k(x, y, t) = T_o(x, y, t) + \sum_{i=1}^{N} B_i(x, y, t)\Delta\alpha_k(i)$$

for k=1, 2, ... M and $\Delta\alpha k(i)=\alpha k(i)-\alpha 0(i)$ and choosing the basis function $B_i(x,y,t)$ to minimize the equation $$\sum_{k=1}^{M} \left\| T_k(x, y, t) - T_o(x, y, t) - \sum_{i=1}^{N} B_i(x, y, t)\Delta\alpha_k(i) \right\|^2.$$

17. The method of claim 15 further comprising repeating steps a) to h) using the updated control parameters and a temperature profile produced using the updated control parameters to provide further updated control parameters.

18. In combination,
a controller operable with a number N of updated control parameters where N is at least one; and
a substrate processing chamber comprising a heating device coupled to the controller to allow the controller to control the temperature of the heating device;
wherein the updated control parameters are derived by the steps of:
a) providing baseline control parameter values $\alpha 0$ comprising spatially resolved and time resolved temperature data of the form $T0(x,y,t)$ for the heating device;
b) acquiring data for a perturbation model for a number, N, of control parameters, N being at least 1, by performing a minimum of N temperature profile measurements, wherein each temperature profile results from perturbing one or more of the control parameters until each of the control parameters has been perturbed;
c) constructing the perturbation model by aligning and synchronizing the temperature profile data so that the data share the same time scale to allow representing the perturbation model as $$T(x, y, t) = T_o(x, y, t) + \sum_{i=1}^{N} B_i(x, y, t)\Delta\alpha_k(i)$$

d) where the functions $B_i(x,y,t)$ are basis functions in the perturbation model, and $\Delta\alpha(i)$ are the perturbations in the ith control parameter from nominal $\alpha 0(i)$ and estimating the basis functions using the data from step b) to complete the perturbation model;
e) measuring an initial temperature profile, $TS(x,y,t)$ of time resolved and spatially resolved temperature data;

f) providing a predetermined performance objective $J(T(x,y,t))$ and constraints C;

g) calculating adjustments for the control parameters using the initial temperature profile, the performance objective, the constraints, and the perturbation model; and h) adjusting the control parameters in the controller using the adjustments so as to provide the updated control parameters for the controller.

19. The combination of claim 18, wherein the chamber is configured for processing a semiconductor wafer.

20. The combination of claim 18, wherein the chamber is configured for plasma etch processes, chemical vapor deposition processes, rapid thermal anneal processes, post exposure bake processes, or ion implantation processes.

21. The combination of claim 18, wherein the chamber is configured so as to be capable of processing a semiconductor wafer, a lithography mask, or a flat panel display.

* * * * *